(12) United States Patent
Malhotra et al.

(10) Patent No.: US 8,765,567 B2
(45) Date of Patent: Jul. 1, 2014

(54) NONVOLATILE MEMORY ELEMENTS

(71) Applicant: Intermolecular Inc., San Jose, CA (US)

(72) Inventors: Sandra G Malhotra, Fort Collins, CO (US); Sean Barstow, San Jose, CA (US); Tony P. Chiang, Campbell, CA (US); Pragati Kumar, Santa Clara, CA (US); Prashant B Phatak, San Jose, CA (US); Sunil Shanker, Santa Clara, CA (US); Wen Wu, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/062,473

(22) Filed: Oct. 24, 2013

(65) Prior Publication Data

US 2014/0051210 A1 Feb. 20, 2014

Related U.S. Application Data

(60) Continuation of application No. 13/656,585, filed on Oct. 19, 2012, now Pat. No. 8,592,282, and a continuation of application No. 13/337,611, filed on Dec. 27, 2011, now Pat. No. 8,318,573, and a division of application No. 12/179,538, filed on Jul. 24, 2008, now Pat. No. 8,294,219.

(51) Int. Cl.
*H01L 21/02* (2006.01)

(52) U.S. Cl.
USPC ...... 438/382; 257/68; 257/296; 257/E21.004; 257/E27.075

(58) Field of Classification Search
USPC ............ 438/382; 257/68, 296, E21.004, 257/E27.084
See application file for complete search history.

(56) References Cited

U.S. PATENT DOCUMENTS

2008/0011996 A1* 1/2008 Bednorz et al. .......... 257/2

* cited by examiner

*Primary Examiner* — Marc Armand

(57) ABSTRACT

Nonvolatile memory elements that are based on resistive switching memory element layers are provided. A nonvolatile memory element may have a resistive switching metal oxide layer. The resistive switching metal oxide layer may have one or more layers of oxide. A resistive switching metal oxide may be doped with a dopant that increases its melting temperature and enhances its thermal stability. Layers may be formed to enhance the thermal stability of the nonvolatile memory element. An electrode for a nonvolatile memory element may contain a conductive layer and a buffer layer.

20 Claims, 12 Drawing Sheets

NONVOLATILE MEMORY ELEMENTS

CROSS-REFERENCE TO RELATED APPLICATIONS

This application is a continuation claiming priority to U.S. patent application Ser. No. 13/656,585 filed 19 Oct. 2012, which is a continuation of U.S. patent application Ser. No. 13/337,611 filed 27 Dec. 2011 (now U.S. Pat. No. 8,318,573), which is a divisional of U.S. patent application Ser. No. 12/179,538 filed 24 Jul. 2008 (now U.S. Pat. No. 8,294,219), which claims priority to U.S. Prov. Pat. App. Ser. Nos. 60/962,023 (filed 25 Jul. 2007) and 60/994,183 (filed 17 Sep. 2007), all of which are entirely incorporated by reference herein for all purposes.

BACKGROUND

This invention relates to nonvolatile memory elements, and more particularly, to nonvolatile memory elements formed from resistive switching metal oxides.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching has been demonstrated using metal oxide films such as layers of nickel oxide. However, challenges remain in producing manufacturable resistive switching memory elements that satisfy desired operating specifications.

It would therefore be desirable to be able to provide improved resistive switching nonvolatile memory elements.

SUMMARY

In accordance with the present invention, nonvolatile memory elements are provided. The nonvolatile memory elements may be provided in an array on an integrated circuit such as a memory device. Conductive signal lines may be used to route signals to and from the nonvolatile memory elements on the memory device.

Nonvolatile memory elements may contain layers of resistive switching metal oxide. Resistive switching metal oxide may exhibit a stable low-resistance state and a stable high-resistance state.

A dopant may be incorporated into a resistive switching metal oxide to elevate the melting point of the resistive switching metal oxide and thereby enhance thermal stability for the nonvolatile memory element. The resistive switching metal oxide may be, for example, titanium oxide doped with aluminum.

Nonvolatile memory elements may contain oxide layers that have elevated melting points. For example, a nonvolatile memory element may have a first oxide layer that is formed of aluminum oxide and a second oxide layer that is formed of titanium oxide. In this type of arrangement, the aluminum oxide layer, which has an elevated melting point, may improve the thermal stability of the nonvolatile memory element and may enhance its performance.

If the resistive metal oxide layer is doped, the dopant used for that layer may be same as the material used in forming other oxide layers. For example, aluminum may be used to form an aluminum oxide layer and aluminum may be used as a dopant for a titanium oxide layer in a resistive switching element.

A nonvolatile memory element may contain conductive electrodes. The conductive electrodes may be formed from one or more layers of conductor. If desired, a conductive electrode may be formed from a metal such as platinum, ruthenium, iridium, etc., or other materials such as metal oxides (e.g., iridium oxide or ruthenium oxide). It may be advantageous to form a buffer layer for the electrode to enhance device stability by preventing conductive materials in the electrode from thermally decomposing when the memory element is heated and by preventing migration of undesired components into the electrode.

Further features of the invention, its nature and various advantages will be more apparent from the accompanying drawings and the following detailed description.

DETAILED DESCRIPTION

The present invention relates to nonvolatile memory elements. The nonvolatile memory elements may be formed of any suitable layers of multistable material. In accordance with an illustrative embodiment of the present invention, which is described herein as an example, nonvolatile memory elements are formed from resistive switching material. The resistive switching material may be, for example, bistable metal oxide.

Nonvolatile memory elements in accordance with the invention may be formed on any suitable type of integrated circuit. Most typically, memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of nonvolatile memory elements to form memory arrays on memory devices is merely illustrative. In general, any suitable integrated circuit may be formed using the memory element structures of the present invention. Memory arrays formed from nonvolatile memory elements are described herein as an example.

Figure 1:
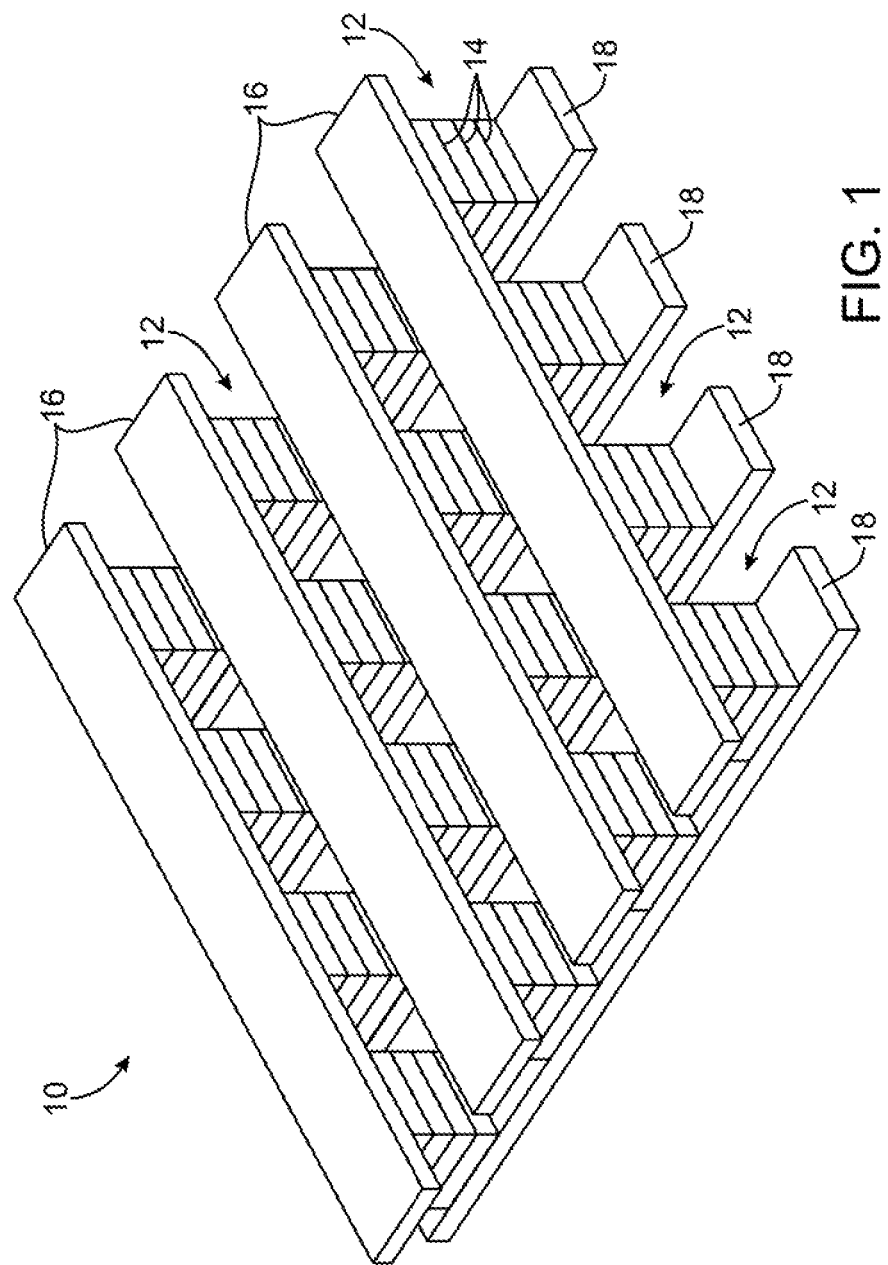
FIG. 1 is a diagram of an illustrative array of nonvolatile memory elements in accordance with an embodiment of the present invention.

An illustrative memory array 10 of nonvolatile memory elements 12 is shown in FIG. 1. Memory array 10 may be part of a memory device or other integrated circuit. Read and write circuitry is connected to memory elements 12 using conductors 16 and conductors 18. Conductors such as conductors 16 and conductors 18 are generally orthogonal. These conductors are sometimes referred to as word lines and bit lines and may be used to read data from the elements 12 in array 10 and to write data into the elements 12 in array 10. Individual memory elements 12 or groups of memory elements 12 can be addressed using appropriate sets of conductors 16 and 18.

Memory elements 12 may be formed from one or more layers of materials, as indicated schematically by lines 14 in FIG. 1. In addition, memory arrays such as memory array 10 can be stacked in a vertical fashion to make multilayer memory array structures.

During a read operation, the state of a memory element 12 can be sensed by applying a sensing voltage to an appropriate set of conductors 16 and 18. The resistance of the memory element at the sensing voltage can be determined by measuring the amount of current that flows through the memory element when the sensing voltage is applied. The sensing voltage is sometimes referred to as a "read voltage" (i.e., Vread).

Depending on its history, a memory element that is addressed in this way may be in one of multiple different states. Memory elements with bistable resistive switching films may exhibit two stable states. Memory elements of this type may be in either a high resistance state or a low resistance state. If the memory element is in its high resistance state, it will have a high resistance at Vread. If the memory element is in its low resistance state, the memory element will have a low resistance at Vread. Data values may be assigned to the high and low resistance values. For example, the memory element may be said to contain a logic one (i.e., a "1" bit) when it exhibits the high resistance at Vread. If, on the other hand, the memory element has the low resistance value, the memory element may be said to contain a logic "zero" (i.e., a "0" bit). These value assignments may be reversed, if desired (i.e., the low resistance state may be said to correspond to a "1" and the high resistance state may be said to correspond to a "0").

During a write operation, the state of the memory element can be changed by application of suitable write signals to an appropriate set of conductors 16 and 18.

The voltage that is used to change a memory element from its high resistance state to its low resistance state is generally referred to as the memory element's set voltage. When a voltage equal to the set voltage is applied to the memory element, the memory element transitions from its high resistance state to its low resistance state.

The voltage that is used to change a memory element back to its high resistance state from its low resistance state is generally referred to as its reset voltage. When a memory element is in its low resistance state and a voltage equal to the reset voltage is applied, the memory element will transition to its high resistance state. The reset voltage may have the same polarity as the set voltage or may have an opposite polarity (i.e., the reset voltage may be negative while the set voltage is positive).

Once the memory element is in use in a device, the read voltage Vread may be applied to the memory element to detect its resistance state (high or low). The amount of current that flows through the memory element at Vread when the memory element is in its high resistance state is generally referred to as its "off current" (i.e., Ioff). The amount of current that flows through the memory element at Vread when the memory element is in its low resistance state is generally referred to as its "on current" (i.e., Ion). In some embodiments, it is desirable for the ratio of Ion to Ioff to be as large as possible, as this makes it easier to detect state changes in the memory element during read operations. For example, it may be desirable for the ratio of Ion to Ioff to be greater than or equal to 5, 50, or 500.

Figure 2:
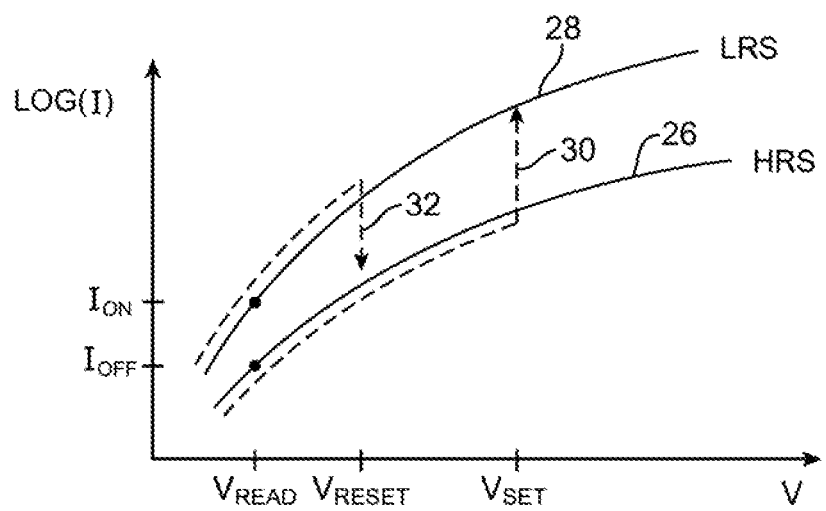
FIG. 2 is a graph showing how a nonvolatile memory element of the type shown in FIG. 1 may exhibit bistable behavior in accordance with an embodiment of the present invention.

A current (I) versus voltage (V) plot for an illustrative nonvolatile memory element 12 is shown in FIG. 2. Initially, element 12 may be in a high resistance state (e.g., storing a logic one). In this state, the current versus voltage characteristic of element 12 is represented by solid line HRS 26. The high resistance state of element 12 can be sensed by read and write circuitry associated with an array of elements 12. For example, read and write circuitry may apply a read voltage $V_{READ}$ to element 12 and can sense the resulting low current $I_{OFF}$ that flows through element 12. When it is desired to store a logic zero in element 12, element 12 can be placed into its low-resistance state. This may be accomplished by using read and write circuitry to apply a voltage $V_{SET}$ across terminals 16 and 18 of element 12. Applying $V_{SET}$ to element 12 causes element 12 to enter its low resistance state, as indicated by dotted line 30. In this region, the structure of element 12 is changed (e.g., through the formation of current filaments through the resistive switching material of element 12 or other suitable mechanisms), so that, following removal of the voltage $V_{SET}$, element 12 is characterized by low resistance curve LRS 28.

The low resistance state of element 12 can be sensed using the read and write circuitry. When a read voltage $V_{READ}$ is applied to resistive switching memory element 12, the read and write circuitry will sense the relatively high current value $I_{ON}$, indicating that element 12 is in its low resistance state. When it is desired to store a logic "one" in element 12, element 12 can once again be placed in its high resistance state by applying a voltage $V_{RESET}$ to element 12. When the read and write circuitry applies $V_{RESET}$ to element 12, element 12 enters its high resistance state HRS, as indicated by dotted line 32. When the voltage $V_{RESET}$ is removed from element 12, element 12 will once again be characterized by high resistance line HRS 26. When $V_{RESET}$ is positive, $V_{SET}$ may be either positive or negative. A situation in which $V_{RESET}$ is positive is illustrated in the example of FIG. 2. In one embodiment, $V_{RESET}$ is positive at an anode of the memory element, while $V_{SET}$ can be positive (for unipolar operation) or negative (for bipolar operation).

The bistable resistance of resistive switching memory element 12 makes memory element 12 suitable for storing digital data. Because no changes take place in the stored data in the absence of application of the voltages $V_{SET}$ and $V_{RESET}$, memory formed from elements such as element 12 is non-volatile.

Any suitable read and write circuitry and array layout scheme may be used to construct a nonvolatile memory device from resistive switching memory elements such as element 12. For example, horizontal and vertical lines 16 and 18 may be connected directly to the terminals of resistive switching memory elements 12.

Figure 3:
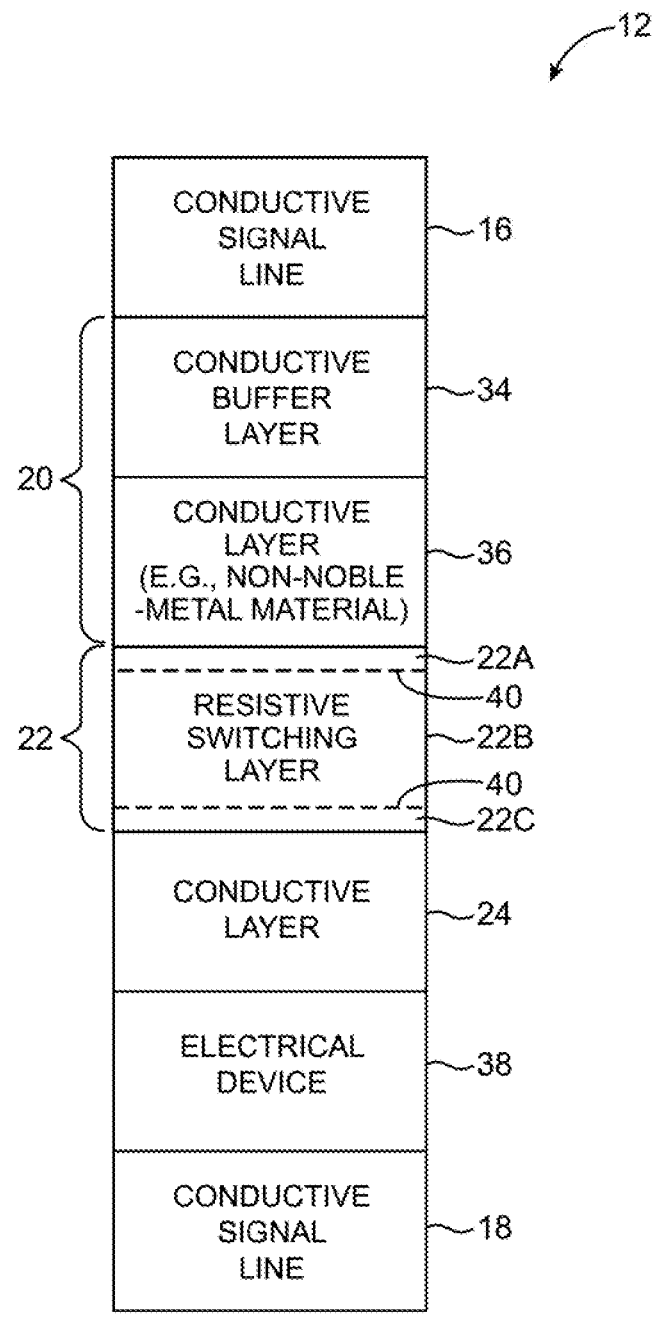
FIG. 3 is a cross-sectional view of an illustrative resistive switching nonvolatile memory element in accordance with an embodiment of the present invention.

A cross-sectional view of an illustrative embodiment of a resistive switching memory element is shown in FIG. 3. In the example of FIG. 3, memory element 12 is formed from a layer of resistive switching material 22. As indicated schematically by lines 40, resistive switching material layer 22 may contain one or more sublayers of resistive switching material (e.g., sublayers such as layers 22A, 22B, and 22C). The layer of resistive switching material 22 and the other layers of device 12 allow device 12 to exhibit multistable behavior, as described in connection with FIG. 1.

Any suitable material may be used for layer 22. With one illustrative arrangement, which is described herein as an example, resistive switching layer 22 may be formed from one or more layers of resistive switching metal oxide. For example, resistive switching layer 22 may be formed from titanium oxide. Other suitable resistive switching metal oxides that may be used to form layer 22 include aluminum oxide, nickel oxide, niobium oxide, zirconium oxide, cobalt oxide, copper oxide, vanadium oxide, tantalum oxide, chromium oxide, molybdenum oxide, tungsten oxide, and manganese oxide. These are merely illustrative examples. Any suitable resistive switching material may be used for layer 22.

If desired, the materials of layer 22 may be doped with suitable dopants. For example, layer 22 may include one or more layers of aluminum oxide interspersed with one or more layers of titanium oxide. In this type of scenario, it may be desirable to incorporate aluminum (e.g., elemental aluminum or aluminum oxide) into the titanium oxide as a dopant to help improve the thermal stability of the titanium oxide and/or to improve resistive switching performance. As another example, one or more of the layers in layer 22 may be doped with hafnium. The use of aluminum and hafnium as dopants is, however, merely illustrative. Other dopant materials may be used to dope layer 22 if desired.

Any suitable concentration of dopant may be used in layer 22. For example, layer 22 may be doped with dopant in an atomic concentration of greater than 1%, greater than 2%, greater than 5%, greater than 10%, 5-10%, 1-15%, or any other suitable concentration range.

The inclusion of dopant in layer 22 may enhance the thermal stability of layer 22 (e.g., by raising its melting point or, when layer 22 includes more than one layer, by raising the melting point of one or more of the sublayers in layer 22). For example, the inclusion of a dopant such as aluminum in a layer 22 formed from titanium oxide may help to raise the melting point of layer 22. A raised melting point is indicative of improved thermal stability. Enhancing the thermal stability of layer 22 may be advantageous, particularly when layer 22 and the other portions of element 12 are formed on an integrated circuit in which other electronic structures are being fabricated. When thermal stability for layer 22 is enhanced, layer 22 is less likely to react with adjacent materials and/or exhibit a change in structure (e.g., due to changes in crystallinity).

With one suitable arrangement, layer 22 may be formed from titanium oxide. A dopant such as aluminum may be incorporated into a titanium oxide layer to increase its melting point and thermal stability. The aluminum may be added in an atomic concentration of greater than 1% or in an atomic concentration of about 1-15% or 5-10% (as examples).

If desired, thermal stability and resistive switching performance may be promoted by using multiple sublayers of material in resistive switching layer 22. Three such sublayers are shown as layers 22A, 22B, and 22C in the example of FIG. 3. Layers 22A and 22C may be, for example, aluminum oxide, whereas layer 22B may be, for example, titanium oxide or titanium oxide doped with aluminum. Arrangements in which a layer of aluminum oxide is sandwiched between two layers of titanium oxide may also be used. In a two layer scenario, the lower layer may be aluminum oxide and the upper layer may be titanium oxide (e.g., doped with aluminum or undoped) or the lower layer may be doped or undoped titanium oxide and the upper layer may be aluminum oxide. Other metal oxides may also be used as sublayers in layer 22 (e.g., oxides formed from different metals and/or with different process conditions).

As shown in FIG. 3, one or more layers of conductor may optionally be connected in series with resistive switching layer 22 in element 12. For example, resistive switching layer 22 may be electrically connected between an upper conductive layer such as a portion of a conductive signal line 16 and a lower conductive layer such as a portion of a conductive signal line 18.

The conductive layers in element 12 may be placed adjacent to resistive switching layer 22 or may be placed adjacent to other layers of material in element 12. For example, there may be layers of conductor only at the topmost and bottommost positions of element 12, there may be a layer of conductor only at the top or only at the bottom of element 12, or there may be any other suitable number of layers of conductor in element 12. The illustrative arrangement of FIG. 3 has an upper conductive signal line 16, a lower conductive signal line 18, an upper conductive electrode 20, a lower conductive electrode 24, and an optional series-connected electrical device 38.

Other layers having various functions may also be included. For example, additional layers may be included in element 12 to modify the electrical properties of element 12, to promote adhesion, to form barrier layers, to form electrical devices, etc. If desired, a conductive layer (e.g., a layer of TiN) may be formed in electrical device 38 (e.g., adjacent to conductive signal line 18) or may be formed between electrical device 38 and conductive signal line 18. Conductive layer 24 and/or conductive signal lines 18 may also be formed from TiN or other suitable conductors or may contain upper or lower layers of TiN or other suitable conductors if desired. Moreover, some of the layers of element 12 that are shown in FIG. 3 may be omitted. As an example, electrical device 38 and lower conductive layer 24 may be omitted. In this type of configuration, conductive signal line 18 may serve as the lower electrode for element 12. If desired, some of the layers of element 12 in FIG. 3 may be omitted and other layer(s) may be added. The example of FIG. 3 is merely illustrative.

The conductive layers in element 12 such as the electrodes and conductive signal lines of element 12 may be formed from any suitable conductive materials. For example, the conductive layers may be formed from metals such as refractory or transition metals, metal alloys, metal nitrides (e.g., refractory metal nitrides, $Ti_{1-x}Al_xN_y$, $Ta_{1-x}Al_xN_y$, TiN, etc.), metal silicon nitrides (i.e., materials containing refractory metals, transition metals, or other metals, along with silicon and nitrogen), metal silicides, conductive metal oxides, doped semiconductors, or other conductors.

Conductive layers such as layers 20 and 24 are sometimes referred to as electrodes. If desired, conductive layers such as conductive signal line 16 and conductive signal line 18 may serve as both conductive lines and as electrodes. In this type of arrangement, line 16 may serve as an upper electrode, so that no separate conductive layer is needed to form an upper electrode for element 12. Similarly, line 18 may serve as a lower electrode, so that no separate conductor is needed to form a lower electrode of element 12.

If desired, one or more optional electrical components may be connected in series with memory element 12. These components, which are sometimes referred to as current steering elements, may include, for example, diodes, p-i-n diodes, silicon diodes, silicon p-i-n diodes, transistors, etc. In the illustrative diagram of FIG. 3, one such current steering element 38 is provided in the lower portion of element 12. Illustrative current steering element 38 of FIG. 3 is connected in series with resistive switching layer 22 and the other components of element 12. There may be any suitable number of current steering elements. For example, there may be two or more current steering elements connected in series with layer 22 and the other components of element 12. Current steering elements such as element 38 may be connected in series in any suitable locations in element 12 (e.g., interspersed among the resistive switching layer, conductors, and other layers of element 12, at a position at the top of element 12, etc.). If desired, series-connected current steering elements such as element 38 may be located in an area of device 10 that is not immediately adjacent to resistive switching layer 22.

Figure 4:
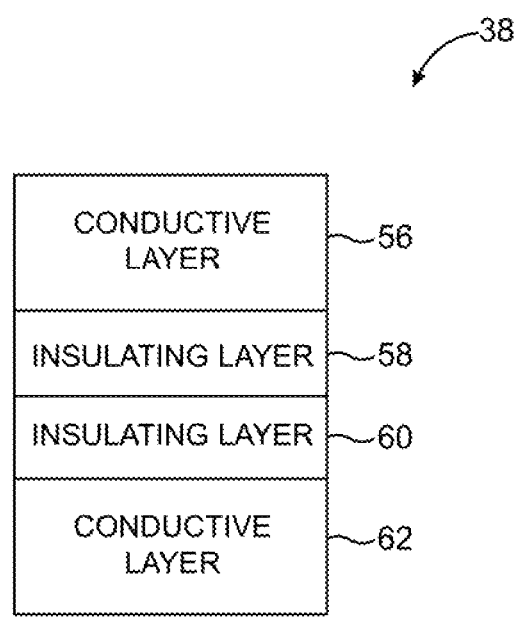
FIG. 4 is a cross-sectional view of an illustrative current steering element that may be used in a nonvolatile memory element in accordance with an embodiment of the present invention.

If desired, current steering element 38 may be based on a non-silicon structure such as a structure formed from conductive materials and insulating materials. As an example, current steering element 38 may be formed from two or more metal layers (or other conductive layers) surrounding two (or fewer or more) layers of insulating materials. Current steering element 38 may, for example, be based on an MIIM diode structure. An illustrative current steering element 38 that is based on an MIIM diode structure is shown in FIG. 4. Conductive layers 56 and 62 may be formed from metals (e.g., metals with different work functions), whereas insulating layers 58 and 60 may be formed from insulators. Under forward bias, a quantum well may be formed between insulating layers 58 and 60 that facilitates tunneling and a non-linear current versus voltage characteristic. The MIIM structure shown in FIG. 4 is merely illustrative. Any suitable structure may be used for current steering element (electronic device) 38 if desired.

Resistive switching layer 22 may be formed from one or more layers of oxide, as described in co-pending patent application No. 60/962,023 (IM0062 Prov.), which is hereby incorporated by reference herein in its entirety. For example, resistive switching layer 22 may be composed of a single layer of resistive switching metal oxide or may be composed of multiple layers of metal oxide. In arrangements with multiple layers of metal oxide, there may be two layers of oxide in layer 22, three layers of oxide in layer 22, etc. The properties of device 12 may be enhanced by the presence of multiple layers of oxide in layer 22. As an example, the ability of device 12 to reliably exhibit multistability may be enhanced by the inclusion of at least one layer of aluminum oxide and at least one titanium oxide layer in layer 22.

In the example of FIG. 3, layer 22 has three oxide layers 22A, 22B, and 22C. These three layers may be used to form a trilayer stack of titanium oxide, aluminum oxide, and titanium oxide. In this example, the aluminum oxide layer that lies in the middle of the titanium oxide layers may have a higher melting point than the melting point of the titanium oxide layers. As another example, a trilayer structure may be formed from a stack of aluminum oxide, titanium oxide, and aluminum oxide. In this example, the aluminum oxide that surrounds the titanium oxide layer may have a melting point that is greater than the melting point of the central titanium oxide layer. Arrangements that omit one or two of these layers or that incorporate other oxide layers or that use different materials may also be used. In general, a multilayer resistive switching layer stack may be formed of any suitable number of oxide layers in any suitable order. Each layer may be formed from a different material or may be formed by a different process. If desired, some of the layers may be formed from the same material and/or the same process. The layers of oxide may all exhibit resistive switching or one or more of the layers may not exhibit resistive switching.

In an illustrative configuration, conductive signal line 16 may be formed from tungsten, top electrode 20 may be formed from a buffer layer 34 and a layer 36 of iridium or a non-noble-metal material such as iridium oxide or ruthenium oxide, a resistive switching layer 22 of titanium oxide on top of aluminum oxide, aluminum oxide on top of titanium oxide, aluminum oxide sandwiched between layers of titanium oxide, titanium oxide sandwiched between layers of aluminum oxide, a lower electrode 24 formed of titanium nitride or other conductors, and a conductive signal line 18 formed from tungsten.

Conductive layers such as electrodes 20 and 24 may be formed of a single layer of conductive material (e.g., a metal, metal alloy, or a conductive semiconductor layer) or may be formed of multiple conductive layers. The composition of the electrodes in device 12 may affect resistive switching performance. Suitable electrode materials include noble metals and non-noble-metal conductors. These materials may exhibit workfunctions of (for example), greater than 4 eV, greater than 5 eV, etc.

Electrode 20 may, as an example, be formed from iridium or other metals. Electrode 20 may also be formed from a conductive non-noble-metal conductor. For example, electrode 20 may be formed from a metal oxide such as iridium oxide ($IrO_2$) or ruthenium oxide ($RuO_2$). An advantage of non-noble-metal conductors is that these materials may be more compatible with standard fabrication processes than noble metals (e.g., Au, Ag). Materials other than platinum (i.e., non-platinum materials) may be more compatible than platinum with some processes and tools (i.e., more process-compatible) and may therefore be suitable for use in electrode 20. An advantage of non-noble-metal conductors such as iridium oxide and ruthenium oxide is that these materials may exhibit satisfactory mechanical properties such as good adhesion while providing acceptable levels of conductivity and process compatibility. If desired, noble metals such as platinum may be used for electrodes such as electrode 20, as these materials have been observed to provide good resistive switching performance. In electrodes that are formed from multiple elements (e.g., multiple materials or layers of materials), there may be some segregation of the elements during processing. For example, during processing of an iridium oxide electrode, it is possible that some of the iridium in the iridium oxide will form one or more iridium-rich layers (e.g., iridium layers or iridium oxide layers with excess iridium). Electrodes formed from segregated layers of material may be satisfactory for use in device 12. These materials and other suitable materials may be used in electrode 20 and/or electrode 24.

If desired, one or both of the electrodes in element 12 may be formed from multiple sublayers. As an example, electrodes such as upper electrode 20 may be formed from conductive layer 36 and conductive layer 34. Conductive layer 36 may be located adjacent to resistive switching metal oxide layer 22 and may be formed from a material such as iridium, iridium oxide (or a mixture of iridium and iridium oxide), or ruthenium oxide (as examples) that allows resistive switching metal oxide layer 22 to exhibit good resistive switching properties. Layer 34 may serve as a buffer layer that helps to stabilize electrode 20. If desired, layers such as layer 34 and 36 may be formed from multiple sublayers of material (e.g., to promote adhesion, etc.).

Layer 36 may be prone to thermal decomposition when heat is applied to element 12 (e.g., during fabrication or during operation). For example, if layer 36 is formed from iridium oxide, the application of heat might produce free iridium that could potentially diffuse through element 12 (e.g., upwards into conductive signal line 16, which might be formed from a metal such as tungsten, aluminum, or copper). This could potentially lead to reliability problems for device 10.

Buffer layer 34 can prevent undesired thermal decomposition and migration of iridium or other materials in layer 36 and can thereby ensure that element 12 exhibits good thermal stability and reliable operation. Buffer layer 34 can also promote stability in element 12 by preventing the material of signal line 16 from migrating into conductive layer 36.

Any suitable material may be used for buffer layer 34. For example, buffer layer 34 may be formed from a metal nitride (e.g., a binary or ternary metal nitride), a metal oxide (e.g., a conductive metal oxide such as nickel oxide or ruthenium oxide), a metal silicon nitride, a metal carbide, or a metal carbide nitride. Suitable buffer layer materials that may be used for layer 34 include metal aluminum nitrides such as titanium aluminum nitride (TiAlN), tungsten aluminum nitride (WAlN), molybdenum aluminum nitride (MoAlN), and tantalum aluminum nitride (TaAlN). Suitable buffer layer materials that may be used for layer also include metal nitrides and metal silicon nitrides such as titanium nitride (TiN), tantalum nitride (TaN), titanium silicon nitride (TiSiN), tantalum silicon nitride (TaSiN), tungsten silicon nitride (WSiN), molybdenum silicon nitride (MoSiN), molybdenum nitride (MoN), and tungsten nitride (WN). Other suitable buffer layer materials that may be used for layer 34 include metal carbides and metal carbide nitrides such as titanium carbide (TiC), titanium carbide nitride (TiCN), tungsten carbide (WC), tungsten carbide nitride (WCN), tantalum carbide (TaC), tantalum carbide nitride (TaCN), molybdenum carbide (MoC), and molybdenum carbide nitride (MoCN). If desired, buffer layer materials may be used for layer 34 such as nickel oxide, ruthenium oxide, or other metal oxides. Materials such as these are thermally stable and conductive and may be chemically compatible with the materials of layer 36 (e.g., with iridium oxide). These are merely illustrative examples of suitable buffer layer materials. Other materials may be used for buffer layers such as buffer layer 34 if desired.

In general, the layers of material in nonvolatile memory element 12 have thicknesses of 5-5000 angstroms. Typical layer thicknesses range from about 50-1000 angstroms or 100-500 angstroms. In electrode 20, for example, layer 36 may have a thickness of about 50-1000 angstroms and layer 34 may have a thickness of about 50-1000 angstroms. These are merely illustrative layer thicknesses. The layers of material in memory element 12 may have any suitable thicknesses.

The layers of material in element 12 may be deposited using any suitable fabrication technique (e.g., physical or chemical vapor deposition, electrochemical deposition, ion implantation, atomic layer deposition, etc.).

As an example, metal oxides for layer 22 may be deposited by sputtering. In an illustrative sputtering arrangement, a first sputtering target may be formed from the base metal of the resistive switching metal oxide layer (e.g., titanium) and a second sputtering target may be formed from a dopant (e.g., aluminum). The material of the second target may be sputtered to form an additional oxide layer (e.g., an aluminum oxide layer) using a reactive sputter or an oxide target, for example. If desired, the material of the first and second targets may be cosputtered to form the resistive switching layer. With a non-reactive sputter, an inert gas such as argon may be used in the sputter chamber. For example, a non-reactive sputter may deposit a metal such as elemental aluminum using an aluminum target. With a reactive sputter, sputtering may be performed in an atmosphere of an inert gas (e.g., argon) and a reactive gas (e.g., oxygen). A reactive sputter can be used to deposit a metal oxide layer, for example, aluminum oxide, using an aluminum target, or titanium oxide using a titanium target. Oxide layers can also be sputter deposited using oxide targets. For example oxide layers can be deposited with a radio frequency (RF) or pulsed direct current (DC) sputter using a titanium oxide target or an aluminum oxide target.

If desired, a doped resistive switching layer may be deposited by sputtering an alloy target (e.g., a target formed of titanium with a 5% atomic concentration of aluminum) using a reactive sputter with a gas mixture of argon and oxygen. A doped resistive switching layer may also be deposited by sputtering a target made up of the desired material for the resistive switching layer (e.g., a target of titanium oxide doped with aluminum).

Layers such as layer 22 may also be formed by depositing multiple layers and applying heat treatment (annealing). As an example, a titanium oxide layer may be deposited. An aluminum layer may then be deposited on the titanium oxide. In some embodiments, both deposited layers may be annealed at a sufficiently high temperature (e.g., over 700° C.) to cause the materials in the layers to react with each other to form a resistive switching metal oxide layer.

Oxide layers such as layers of aluminum oxide that improve thermal stability for resistive switching metal oxide may be sputter deposited (e.g., from a metal target in a gas mixture of argon and oxygen, from a metal oxide target using argon, etc.).

It has been observed experimentally that the materials used in resistive switching metal oxide layer 22 affect the off current (Ioff of FIG. 2) and the separation between the set voltage Vset (FIG. 2) and the reset voltage Vreset (FIG. 2). For example, a resistive switching layer formed from hafnium oxide and niobium oxide may exhibit relatively larger values of Ioff (e.g., 150 nA to 450 nA), whereas a resistive switching layer in a comparably sized test sample that is formed from aluminum oxide and titanium oxide may exhibit relatively smaller values of Ioff (e.g., 1-25 nA).

The separation between Vset and Vreset has been observed to track the Ioff value. Relatively larger separations between Vset and Vreset have been observed when using high Ioff materials such as hafnium oxide and niobium oxide in layer 22, whereas relatively smaller separations between Vset and Vreset have been observed when using low Ioff materials such as aluminum oxide and titanium oxide in layer 22. These observed relationships may be used to tailor the properties of nonvolatile memory element 12 during fabrication. In particular, these properties allow selection of the resistive switching layer for device 12 based on the off current Ioff to obtain a desired separation between Vset and Vreset. In situations in which a large Vset/Vreset separation is desired, materials may be chosen for layer 22 that exhibit relatively larger Ioff values.

Figure 5:
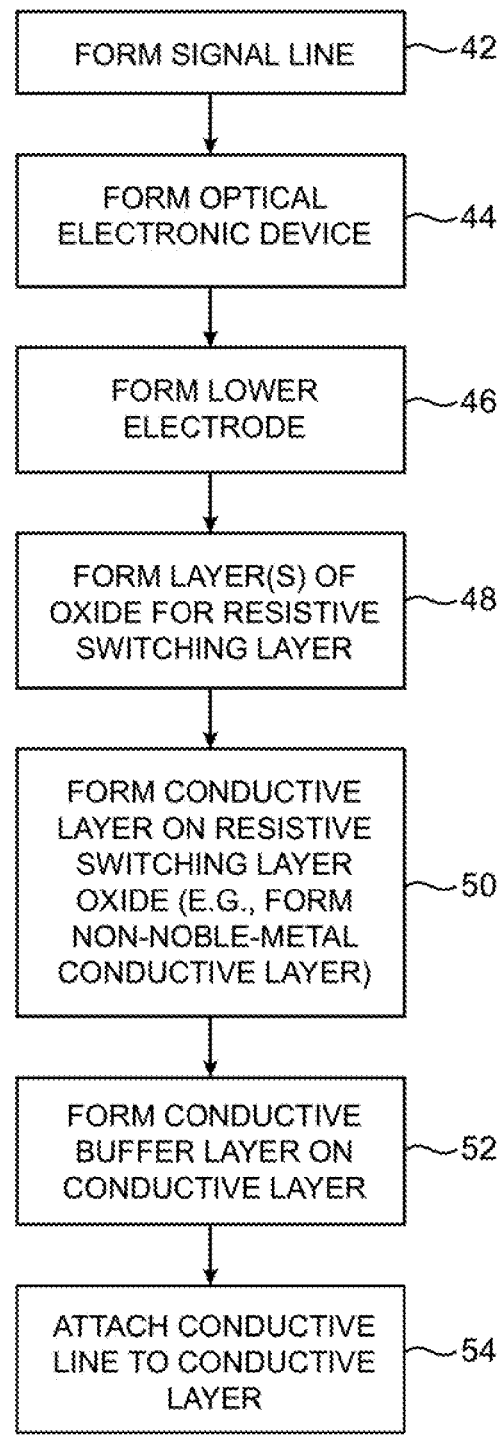
FIG. 5 is a flow chart of illustrative steps involved in forming resistive switching nonvolatile memory elements in accordance with an embodiment of the present invention.

Illustrative steps involved in fabricating a nonvolatile memory element such as a memory element of the type shown in FIG. 3 are shown in FIG. 5.

At step 42, a conductive layer for a conductive signal line such as line 18 may be formed on device 10. Any suitable material may be used for this conductive layer. Examples of suitable conductive layer materials for line 18 are titanium nitride and tungsten. These are, however, merely illustrative. The conductive layer for signal line 18 may be formed from any suitable conductive material (e.g., metal, metal alloy, metal nitride, multiple layers of material, etc.).

At step 44, an optional current steering element such as device 38 of FIG. 3 may be formed. Current steering element 38 may include one or more layers of conductor such as a layer of TiN. A layer of TiN or other conductor in current steering element 38 may be adjacent to a line 18 that has been formed of tungsten (as an example). The current steering element may, as an example, be formed by depositing layers of material on line 18. The current steering element 38 (electrical device 38) may be formed of semiconductors such as silicon (as an example) or using materials other than silicon (e.g., in a MIIM diode structure). If desired, step 44 may be repeated at an appropriate stage to form additional optional electrical devices. Step 44 may also be performed later (e.g., after step 46), so that conductive layer 24 (e.g. a layer of TiN) may be formed between electrical device 38 and conductive signal line 18.

At step 46, a conductive layer such as layer 24 may be formed. The conductive layer 24 may include one or more sublayers. Conductive layer 24 may serve as a lower electrode for nonvolatile memory element 12. Conductive layer 24 may be formed of any suitable conductor (e.g., noble metals, non-noble-metal conductive materials, etc.).

At step 48, a resistive switching metal oxide layer such as layer 22 of FIG. 3 may be formed. Layer 22 may include one or more sublayers (e.g., one or more layers of aluminum oxide interspersed with one or more layers of titanium oxide).

An upper electrode 20 for element 12 may be formed during steps 50 and 52.

At step 50, a conductive layer such as layer 36 for electrode 20 may be formed on resistive switching metal oxide layer 22. Any suitable conductive material (e.g., iridium) may be deposited on layer 22. If desired, a noble metal such as platinum may be deposited. With one suitable arrangement, a non-noble-metal conductor such as a layer of iridium oxide or ruthenium oxide may be deposited on resistive switching metal oxide layer 22. These layers may be more process compatible than layers of pure noble metals. Iridium oxide may be advantageous because it generally exhibits superior adhesion to metals such as iridium.

At step 52, a buffer layer may be formed on the conductive layer that was formed at step 50. For example, a buffer layer formed from a conductive metal oxide, a metal nitride, or a metal silicon nitride may be formed on layer 36. If layer 36 is formed from a noble metal, the buffer layer formation step may be omitted. If layer 36 is formed from a non-noble-metal material such as iridium or iridium oxide, the buffer layer may be used to prevent metal from subsequently formed signal conductor lines such as line 16 from migrating into resistive switching metal oxide layer 22 and may enhance the thermal stability of layer 36. For example, the buffer layer may prevent iridium in an iridium oxide layer 36 from decomposing and migrating out of layer 22.

At step 54, a conductive upper signal line such as line 16 may be formed (e.g., by depositing a layer of metal or other conductive material on the buffer layer that was formed at step 52). The conductive upper signal line may be formed from tungsten (as an example).

As set forth above, a number of considerations influence which materials may be satisfactorily used in device 12. In connection with electrode selection, an electrode material or materials should be selected that helps device 12 exhibit good resistive switching behavior. At the same time, considerations such as process compatibility may influence electrode material selection. Materials such as platinum may exhibit good resistive switching when used in electrodes, but are sometimes not compatible or are less-compatible with certain processing techniques. When platinum is introduced into a manufacturing process, special care is sometimes needed to avoid contaminating process equipment (e.g., by dedicating certain process tools to handling platinum). Materials other than the potentially process-incompatible materials such as platinum may be considered to be process compatible or process friendly. Process compatible materials that may be used for electrodes in device 12 include, for example, non-platinum materials such as iridium oxide and ruthenium oxide (as examples).

During processing, electrode layers and other layers in device 12 that have been formed from more than one element may experience changes. For example, some of the iridium in an iridium oxide layer may segregate to form an iridium layer or a portion in the iridium oxide that is more iridium rich than other portions. Layers that include one or more segregated layers or other mixtures of materials may be used for electrode layers in device 12.

A typical device 12 may include a tungsten upper signal line, an upper electrode formed from a conductive buffer layer over a layer of iridium oxide (e.g., a layer of iridium oxide that has an associated segregated layer of iridium), a trilayer of resistive switching oxide materials such as an aluminum oxide layer sandwiched between two adjacent layers of titanium oxide, a titanium nitride lower electrode, and a tungsten lower signal line.

As described in connection with FIG. 3, thermal stability and resistive switching performance may be promoted by using multiple sublayers of material in resistive switching layer 22 such as layers 22A, 22B, and 22C. As an example, a layer of aluminum oxide may be included in layer 22 in addition to one or more layers of titanium oxide.

It has been demonstrated experimentally that elements 12 with an oxide layer such as an aluminum oxide layer in addition to an oxide layer such as a titanium oxide layer exhibit improved ratios of $I_{ON}$ to $I_{OFF}$, improved (decreased) values of $I_{OFF}$, and improved thermal stability. It has also been demonstrated that incorporation of appropriate dopant into resistive switching layer 22 decreases on current $I_{ON}$ and forming voltage $V_f$ and increases thermal stability. Elements 12 may include one or more oxide layers in oxide layer 22, may include one or more dopants (e.g., dopants such as aluminum dopant in titanium oxide) that increase the melting temperature of resistive switching oxide in layer 22, or may include one or more oxide layers and one or more dopants in layer 22.

Figure 6:
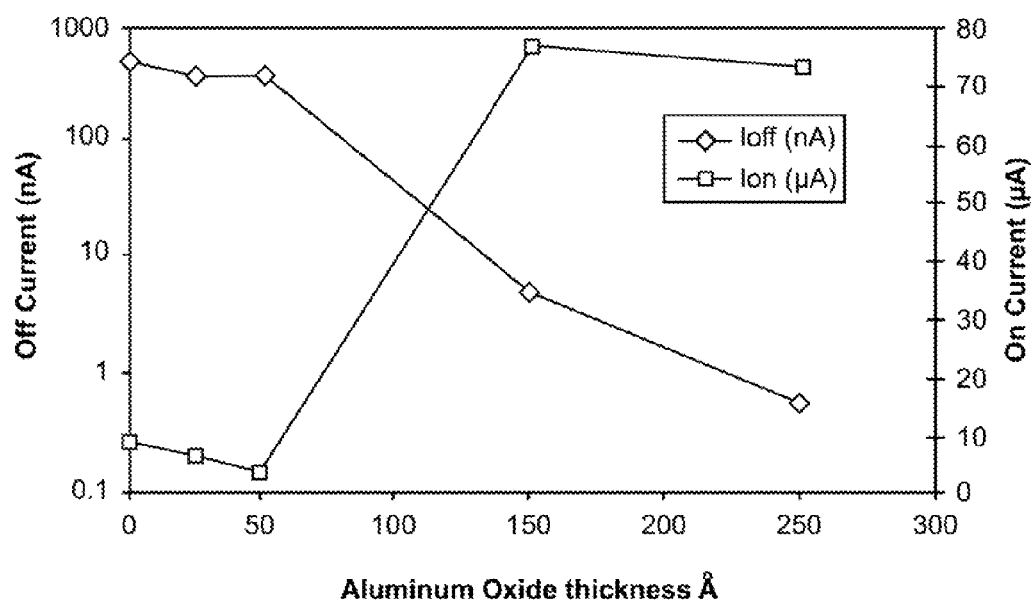
FIG. 6 is a graph showing measured on currents and off currents for an illustrative resistive switching film in accordance with an embodiment of the present invention.

Experimental data for illustrative elements 12 with additional oxide layers of various thicknesses is shown in FIG. 6. The elements 12 that were formed for the FIG. 6 experiments had a platinum upper electrode and a titanium nitride lower electrode, resistive switching layers formed of titanium oxide, and an interposed oxide layer formed of aluminum oxide. The thickness of the aluminum oxide layer in element 12 varied from 0 angstroms (no aluminum oxide layer) to 250 angstroms. The total thickness of both the aluminum oxide layer and the titanium oxide layer was maintained at 250 angstroms. As shown in FIG. 6, Ioff decreased dramatically and high ratios of $I_{ON}$ to $I_{OFF}$ were obtained for aluminum oxide thicknesses of greater than or equal to about 150 angstroms (titanium oxide thicknesses of less than or equal to about 100 angstroms). In some embodiments, the increased resistivity of the aluminum oxide layer improves the ratio of $I_{ON}$ to $I_{OFF}$.

Figure 7A:
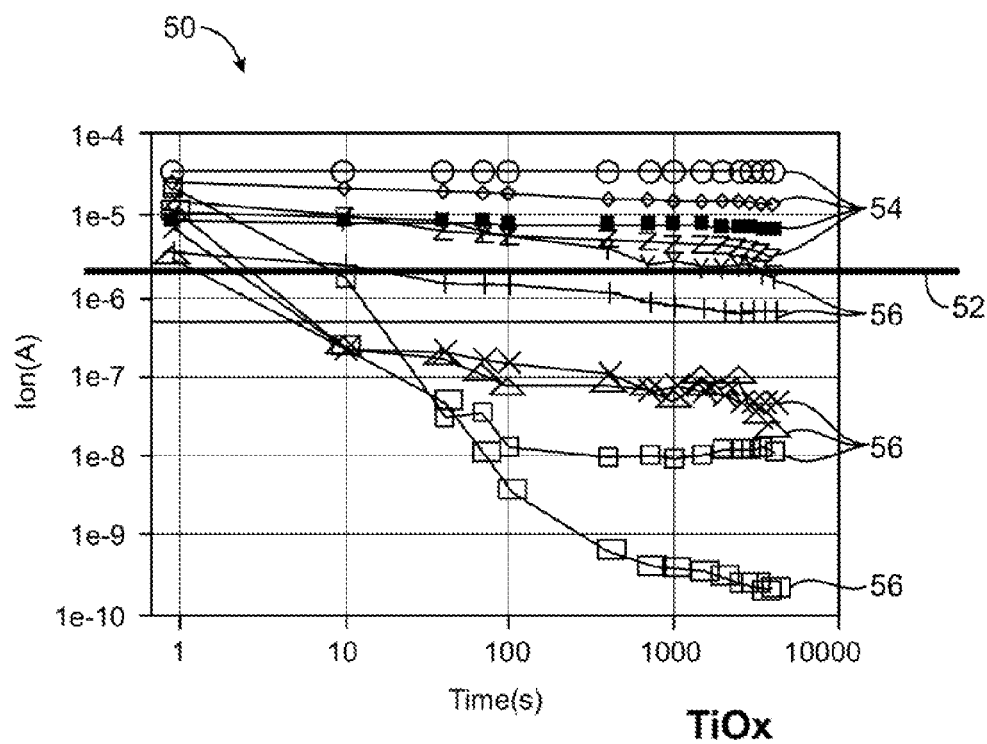
FIGS. 7A and 7B are graphs illustrating improved data retention in accordance with an embodiment of the present invention.
Figure 7B:
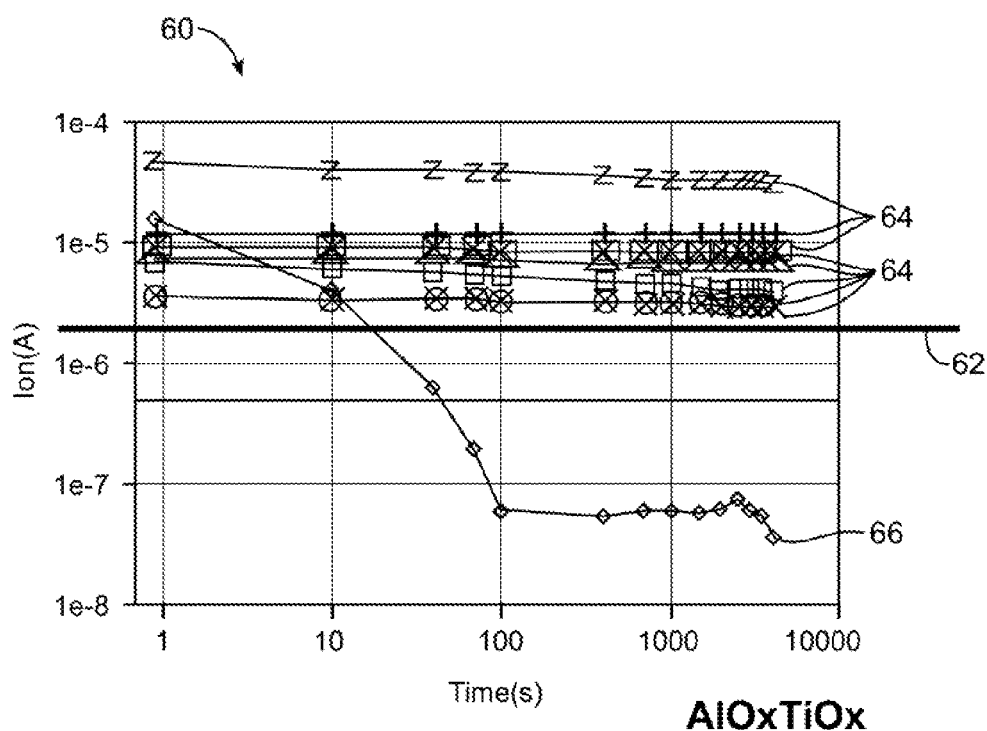

FIGS. 7A and 7B are graphs illustrating improved data retention in accordance with an embodiment of the invention. Data retention describes a ratio of the number of devices that switch from one state to another without the application of a set or reset voltage, for example from on to off. Fewer devices switching indicates better performance. These tests were performed at 85° C., which can be considered an indication of thermal stability.

The graph 50 in FIG. 7A illustrates the change in read current over time for ten memory elements having a titanium oxide layer alone (i.e., without an oxide layer 25). A current above the line 52 indicates an "on," while a current below the line 52 indicates an "off." The plots 54 represent those devices that did not spontaneously switch, and retained an "on" value over time. The plots 56 represent those devices that switched. As can be seen in the graph 50, six of ten devices switched from on to off without the application of a reset voltage when only a titanium oxide layer is used.

The graph 60 in FIG. 7B illustrates the change in read current over time for ten memory elements having a titanium oxide layer in combination with an aluminum oxide layer (i.e., an oxide layer 25). As with the graph 50, currents above the line 62 indicate an "on," while currents below the line 62 indicate an "off." The plots 64 represent those devices that did not spontaneously switch, and retained an "on" value over time. The plots 66 represent the device that switched. As can be seen in the graph 60, only one of ten devices switched from on to off without the application of a reset voltage when an aluminum oxide layer is used in conjunction with a titanium oxide layer. Further, as can be seen in the graph 60, the devices retained data for several thousand seconds.

Therefore, stacked memory elements with a resistive switching metal oxide as well as an additional metal oxide exhibit improved thermal stability and data retention.

Figure 8:
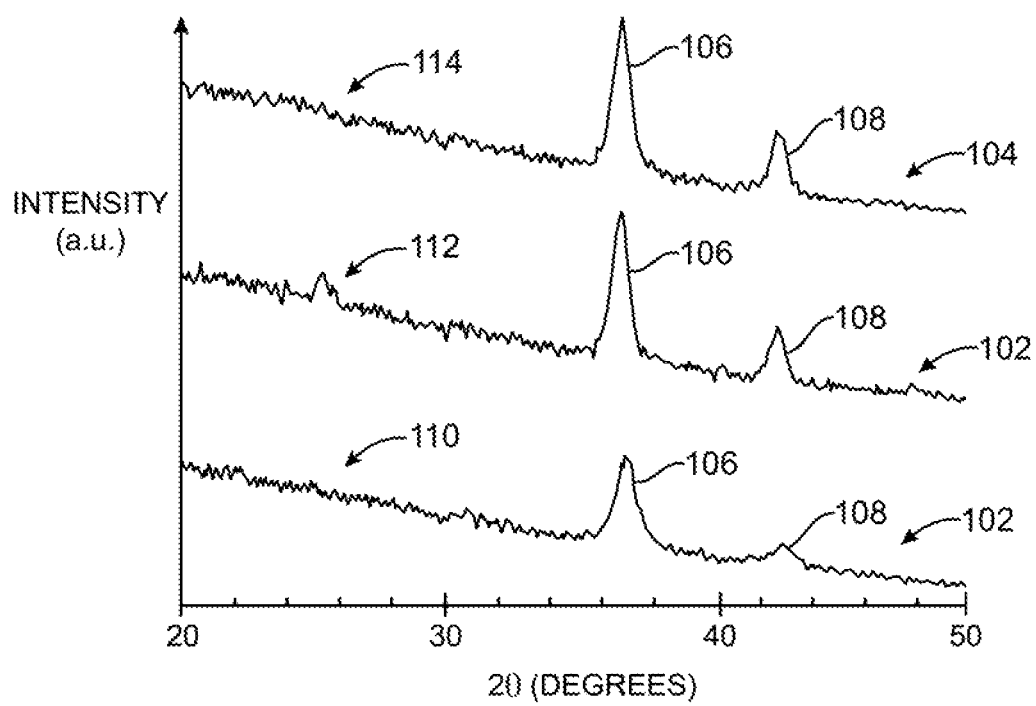
FIG. 8 is a graph of x-ray diffraction data showing how different resistive switching films respond to heat exposure in accordance with an embodiment of the present invention.

X-ray diffraction test results for blanket TiN/doped $TiO_x$ samples are presented in FIG. 8. In these experiments, a resistive switching layer 22 of titanium oxide doped with aluminum was formed. The layer 22 was deposited by cosputtering aluminum and titanium using a gas mixture of argon and oxygen. The thickness of the layer was 150 angstroms. The atomic concentration of the aluminum dopant in the titanium oxide layer was 5% for the samples corresponding to traces 100 and 102 and 10% for the sample corresponding to trace 104. The sample of trace 100 was not exposed to rapid thermal annealing. X-ray diffraction peaks 106 and 108 correspond to titanium nitride peaks from the underlying layer.

Trace 102 corresponds to a 5% aluminum dopant sample following rapid thermal annealing (750° C. for 1 minute). In trace 100 (pre RTA), there is no peak in region 110. In contrast, following rapid thermal annealing, the 5% aluminum dopant sample of trace 102 exhibits a small peak 112 in this region. Peak 112 corresponds to the anatase phase of the titanium oxide layer and serves as evidence of an amorphous to crystalline phase transition taking place in the sample. This shows that there is some lack of thermal stability in the titanium oxide layer that contained 5% aluminum dopant. In contrast, trace 104, which corresponds to the titanium oxide sample doped with 10% aluminum, there is no evidence of the anatase phase (i.e., there is no peak in region 114 of trace 104). This demonstrates that the doping helps prevent or minimize phase transition. This further demonstrates that the thermal stability of the titanium oxide layer may be enhanced by incorporation of aluminum dopant in a 10% atomic concentration.

FIGS. 9, 10, 11, and 12 show electrical characterization measurements that were performed on test devices containing pure titanium oxide resistive switching layers (labeled "0" on the x-axis) and test devices containing titanium oxide doped with aluminum in a 12% atomic concentration.

Figure 9:
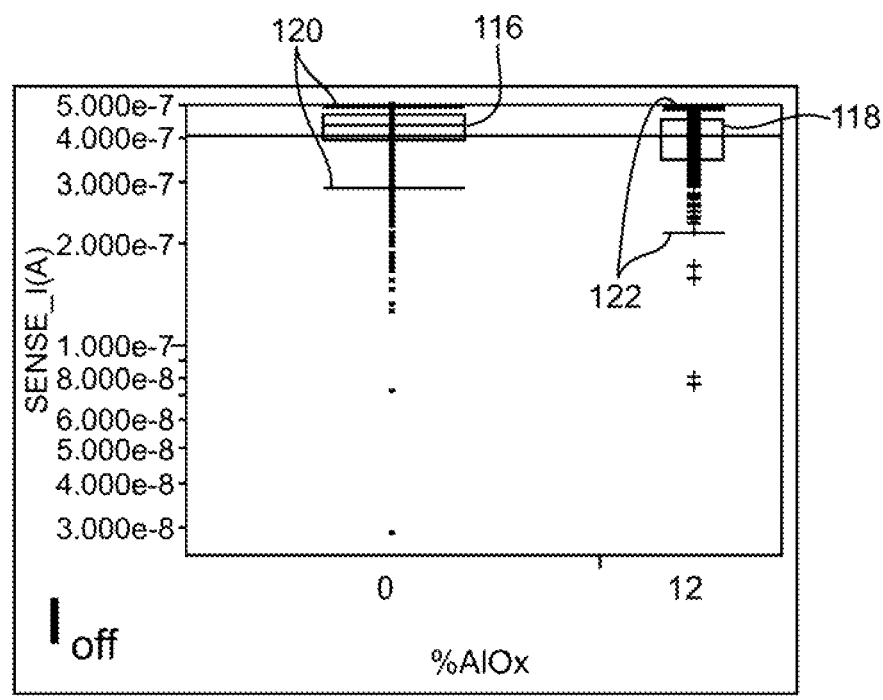
FIG. 9 is a graph of off current thermal stability test results for resistive switching films with two different doping levels in accordance with an embodiment of the present invention.
Figure 10:
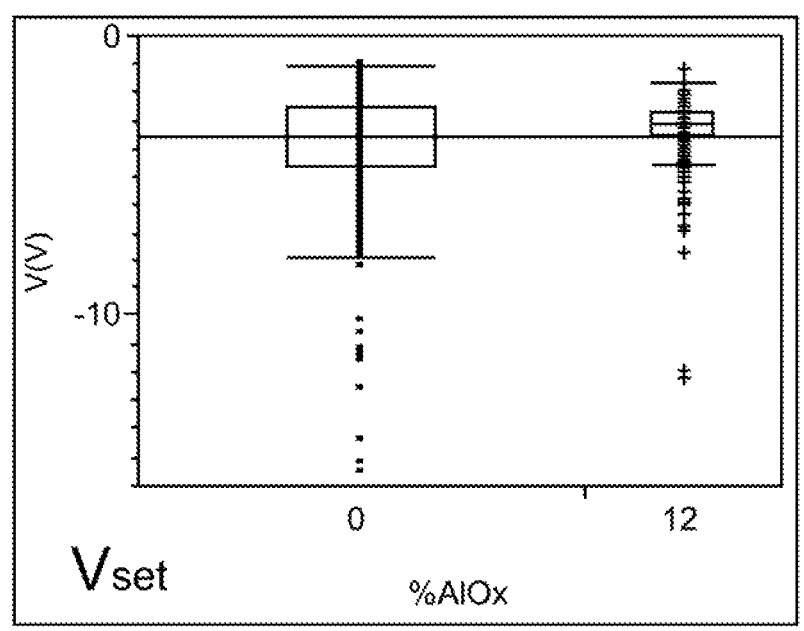
FIG. 10 is a graph of set voltage thermal stability test results for resistive switching films with two different doping levels in accordance with an embodiment of the present invention.
Figure 11:
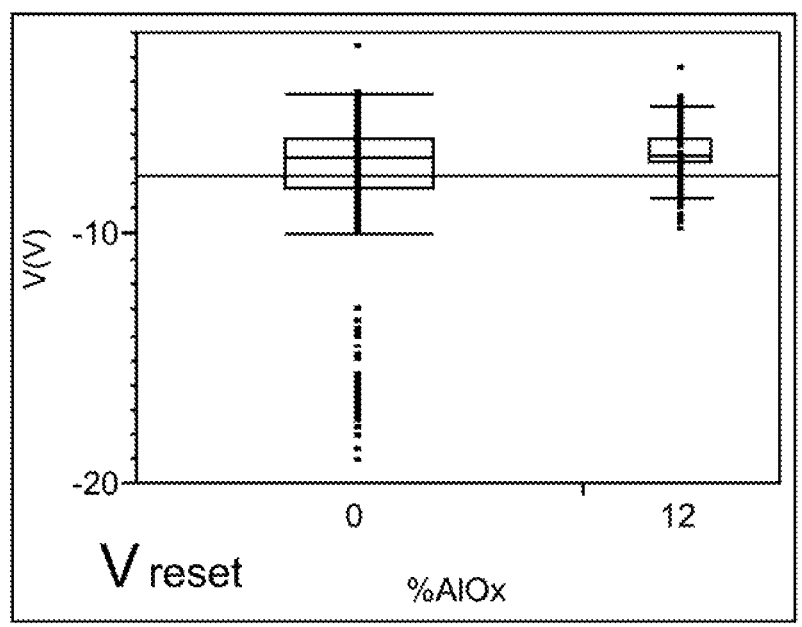
FIG. 11 is a graph of reset voltage thermal stability test results for resistive switching films with two different doping levels in accordance with an embodiment of the present invention.

FIG. 9 shows measured values of off current (Ioff). FIG. 10 shows measured values of set voltage (Vset). FIG. 11 shows measured values of reset voltage (Vreset). Forming voltage measurements ($V_f$) are plotted in FIG. 12.

Each of FIGS. 9-12 contains data distribution boxes such as data distribution boxes 116 and 118 of FIG. 9. Each of FIGS. 9-12 also contains data distribution lines such as lines 120 and 122 of FIG. 9. The upper and lower sides of the data distribution boxes enclose 25% of the measured data. The position of each data distribution box is centered on the mean of the measured data. Data distribution lines such as lines 120 and 122 denote the upper and lower bounds within which 75% of the measured data falls.

As indicated in FIGS. 9, 10, and 11, when aluminum dopant in a 12% atomic concentration is added to the titanium oxide resistive switching layer, the data shows a tighter distribution (i.e., less variance), indicating improvement.

Figure 12:
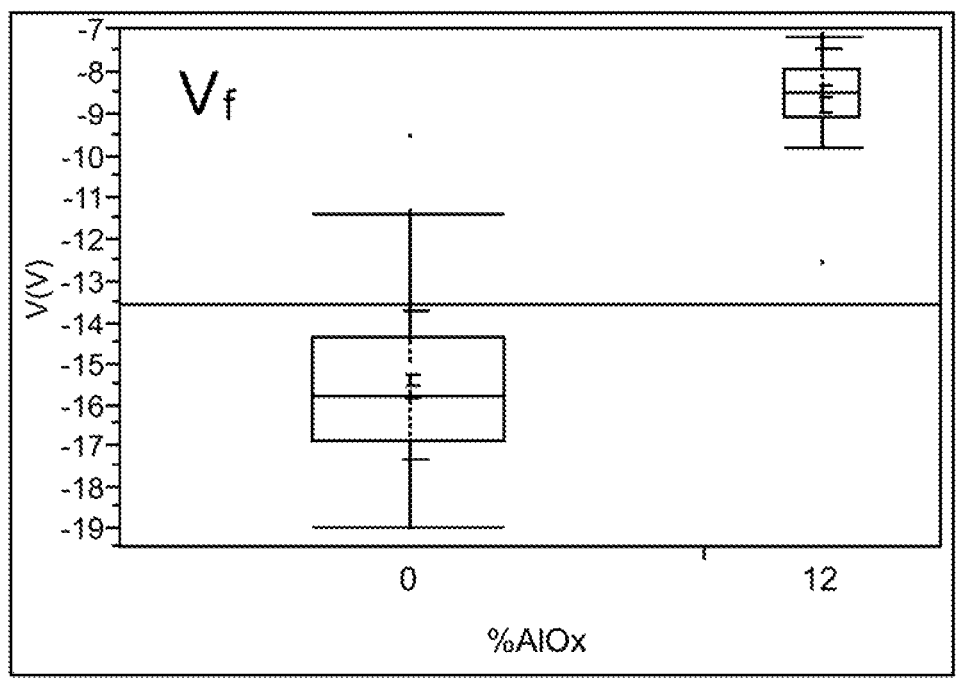
FIG. 12 is a graph of forming voltage thermal stability test results for resistive switching films with two different doping levels in accordance with an embodiment of the present invention.

Additionally, as shown in FIG. 12, the data distribution for the sample of titanium oxide doped with aluminum (the right-hand side of FIG. 12) is significantly less spread out than the data distribution for the undoped titanium oxide sample (the left-hand side of FIG. 12). Moreover, the forming voltage $V_f$ decreases significantly in magnitude with added aluminum dopant (i.e., from about 16 volts to about 9.5 volts). A reduced forming voltage is desirable.

The foregoing is merely illustrative of the principles of this invention and various modifications can be made by those skilled in the art without departing from the scope and spirit of the invention.

What is claimed is:

1. A method of forming a nonvolatile memory element comprising:

forming a conductive electrode layer;

forming a first layer, comprising an oxide of a first element, on the conductive electrode layer;

forming a second layer, comprising an oxide of a second element, on the first layer; and processing the conductive electrode layer, the first layer and the second layer such that the combination of the first layer and the second layer comprises a resistive switching layer characterized by:

a high resistance state and a low resistance state, a set voltage $V_s$ that switches the resistive switching layer from the high resistance state to a low resistance state, and a reset voltage $V_r$ that switches the resistive switching layer from the low resistance state to the high resistance state;

wherein at least one of the first element and the second element is selected such that the difference between $V_s$ and $V_r$ is greater than a predetermined value.

2. The method of claim 1, wherein one of the first element or the second element is hafnium, and the other of the first element or the second element is niobium.

3. The method of claim 1, further comprising forming a current steering element, wherein the conductive electrode layer is formed on the current steering element.

4. The method of claim 3, wherein the current steering element comprises one of a p-i-n diode, a silicon diode, a silicon p-i-n diode, or a transistor.

5. The method of claim 3, wherein the current steering element is formed over a conductive signal line.

6. The method of claim 1, further comprising forming a second conductive electrode layer over the second layer, wherein the second conductive electrode layer comprises titanium nitride.

7. The method of claim 1, wherein the conductive electrode layer comprises a buffer layer and an additional layer.

8. The method of claim 7, wherein the additional layer comprises one of iridium, iridium oxide, or ruthenium oxide.

9. The method of claim 7, wherein the additional layer is adjacent to the first layer.

10. The method of claim 1, further comprising forming a third oxide layer on the second layer.

11. A method of forming a nonvolatile memory element comprising:

forming a conductive electrode layer;

forming a first layer of a first thickness on the conductive electrode layer, wherein the first layer comprises a metal oxide;

forming a second layer of a second thickness on the first layer; and processing the conductive electrode layer, the first layer and the second layer such that the combination of the first layer and the second layer comprises a resistive switching layer characterized by:

a high resistance state and a low resistance state, and an off current Ioff that flows when the resistive switching layer is in the high resistance state;

wherein at least one of the first thickness and the second thickness is selected such that the off current $I_{off}$ is greater than a predetermined value.

12. The method of claim 11, wherein one of the first layer or the second layer comprises hafnium, and the other of the first layer or the second layer comprises niobium.

13. The method of claim 11, further comprising forming a current steering element, wherein the conductive electrode layer is formed on the current steering element.

14. The method of claim 13, wherein the current steering element comprises one of a p-i-n diode, a silicon diode, a silicon p-i-n diode, or a transistor.

15. The method of claim 13, wherein the current steering element is formed over a conductive signal line.

16. The method of claim 11, further comprising forming a second conductive electrode layer over the second layer, the second conductive electrode layer comprising titanium nitride.

17. The method of claim 11, wherein the conductive electrode layer comprises a buffer layer and an additional layer.

18. The method of claim 17, wherein the additional layer comprises one of iridium, iridium oxide, or ruthenium oxide.

19. The method of claim 17, wherein the additional layer is provided adjacent to the first layer.

20. The method of claim 11, further comprising forming a third oxide layer on the second layer.

\* \* \* \* \*